United States Patent [19]

Thomas

[11] 4,301,380
[45] Nov. 17, 1981

[54] VOLTAGE DETECTOR

[75] Inventor: James S. Thomas, Manor, Tex.

[73] Assignee: Motorola, Inc., Schaumburg, Ill.

[21] Appl. No.: 35,142

[22] Filed: May 1, 1979

[51] Int. Cl.³ .................. H03K 5/153; H03K 5/24; H03K 17/693

[52] U.S. Cl. .................. 307/362; 340/636; 340/663; 368/66; 307/358; 307/297

[58] Field of Search .......... 307/200 B, 358, 297, 307/350, 362, 364, 363, 304; 320/43, 48; 340/636, 663; 368/10, 66

[56] References Cited

U.S. PATENT DOCUMENTS

| 3,949,545 | 4/1976 | Chihara | 368/66 |
| 3,993,985 | 11/1976 | Chopard et al. | 340/636 |
| 4,000,411 | 12/1976 | Sano et al. | 307/205 |
| 4,024,415 | 5/1977 | Matsuura | 307/362 |
| 4,043,110 | 8/1977 | Chihara | 368/66 |
| 4,119,904 | 10/1978 | Haglund | 340/636 X |
| 4,140,930 | 2/1979 | Tanaka | 307/200 B X |
| 4,142,118 | 2/1979 | Guritz | 307/358 |
| 4,173,756 | 11/1979 | Kawagai et al. | 368/66 X |
| 4,217,535 | 8/1980 | Suzuki et al. | 307/304 X |
| 4,224,539 | 9/1980 | Musa et al. | 307/297 X |

Primary Examiner—Larry N. Anagnos
Attorney, Agent, or Firm—Anthony J. Sarli, Jr.; Vincent P. Ingrassia; Jeffrey Van Myers

[57] ABSTRACT

An MOS low voltage detector circuit includes a comparator which compares an internally generated reference voltage with an internally generated non-linear voltage. Both the reference voltage and the non-linear voltage are derived from a supply voltage, and the comparator generates an output whenever the divided down non-linear voltage falls below the reference voltage. This output is supplied to a series of regularly biased MOS inverter stages which not only amplify the comparator output but also amplify the inherent offset error in the comparator itself. Voltage compensating means may also be included in the comparator.

13 Claims, 3 Drawing Figures

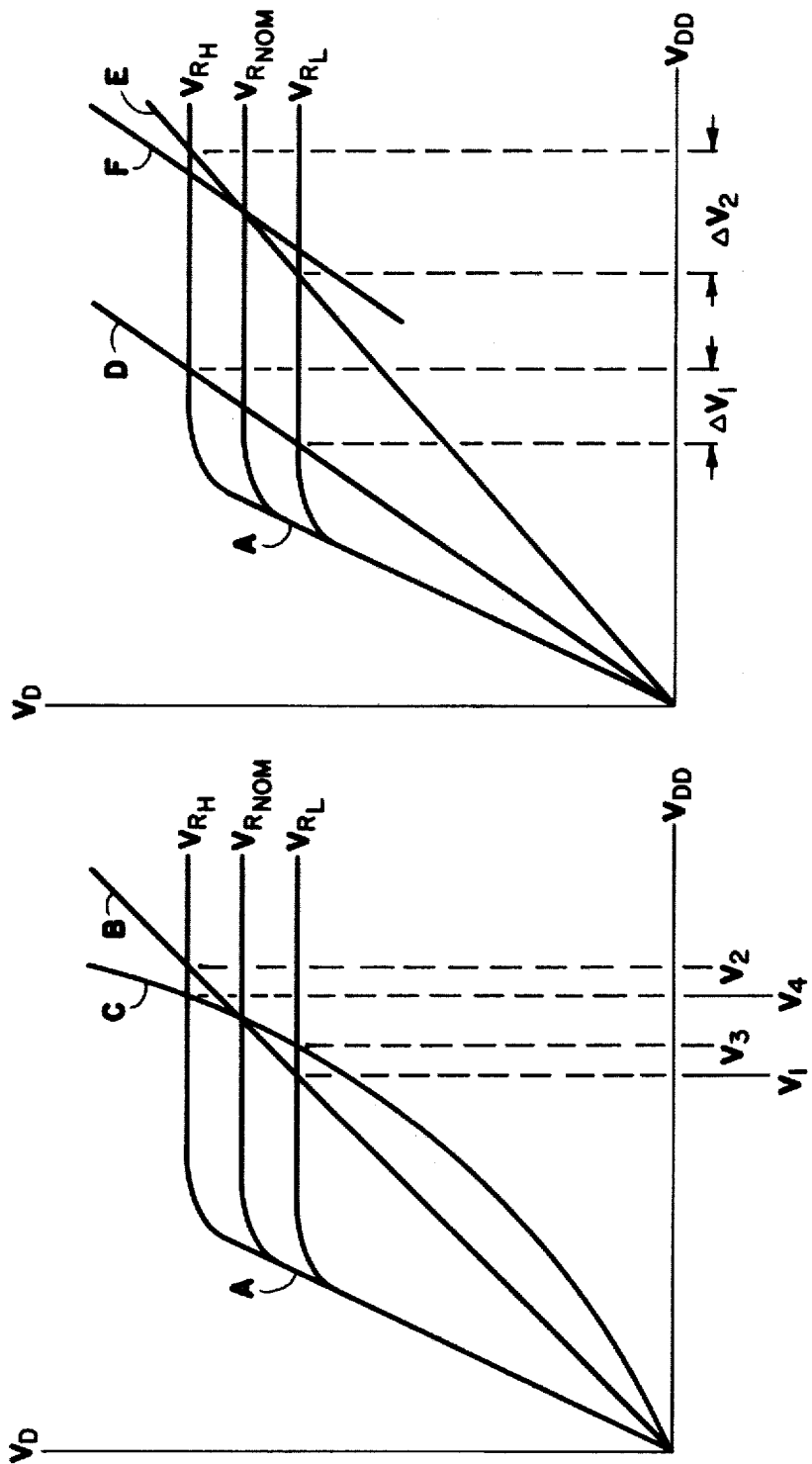

VOLTAGE DETECTOR

BACKGROUND OF THE INVENTION

1. Field of the Invention

This invention relates generally to voltage detectors and, more particularly, to an MOS circuit having an output stage which changes state when the circuit's own supply voltage crosses an internally generated reference voltage.

2. Description of the Prior Art

The advantages offered by MOS technology are well known; e.g. higher density, greater yield, etc. Thus, smaller MOS device geometries permit a greater number of devices to be produced per unit area, or, stated another way, a single MOS device will occupy less space. This characteristic is extremely important in the design and fabrication of complex digital integrated circuits; for example, single chip microprocessors.

Whereas digital circuitry is generally characterized by its "ON/OFF" or "ONE/ZERO" nature, most measurements in the real world are inherently analog; e.g. temperature, pressure, speed, voltage, etc. Therefore it is necessary that microprocessors and other digital circuitry communicate or interface with analog circuitry such as amplifiers, buffers, comparators, etc., in order to permit digital processing of the analog signals. The required interfacing may be accomplished by providing analog components which are external to the microprocessor chip. However, such arrangements generally require a larger power supply, more current, and commonly present more opportunities for design and manufacturing errors. To avoid these disadvantages, analog circuits are being manufactured integrally with the digital circuitry; e.g., on the microprocessor chip itself, and due to the complex nature of microprocessors, the inclusion of analog devices on the same chip requires that the same manufacturing process be employed.

As is well known, microprocessors are comprised of counters, registers and other digital circuitry, and it is necessary that such circuitry be initialized to a predetermined state whenever the supply voltage is below some minimum operational value as when power is first turned on and during power failures. Such circuitry has, in the past, been implemented with external discrete components such as timers and comparators in the power supply line which detect a low voltage condition. This, however greatly increases system costs, and users of microprocessor chips are reluctant to undergo the additional expense.

SUMMARY OF THE INVENTION

It is an object of the invention to provide an improved voltage detector.

It is a further object of the invention to provide an improved voltage detector which may be implemented on a microprocessor chip.

It is a still further object of the invention to provide an MOS voltage detector which generates an output when its own supply voltage falls below a predetermined threshold value, which threshold value is greater than an internally generated reference potential.

Finally, it is an object of the present invention to provide an improved low voltage detector which may be implemented entirely with N-channel MOS devices.

According to a broad aspect of the invention there is provided a circuit for detecting when a supply voltage falls below a predetermined value, comprising: first means for receiving said supply voltage and generating therefrom a first reference voltage; voltage dividing means coupled to said supply voltage for producing a non-linear divided voltage therefrom; comparing means coupled to said first and second means for generating an output when said divided voltage falls below said first reference voltage; and amplifying means coupled to said comparing means for amplifying said output.

The above and other objects, features and advantages of the present invention will be more clearly understood from the following detailed description taken in conjunction with the accompanying drawings, in which:

BRIEF DESCRIPTION OF THE DRAWINGS

FIGS. 2a and 2b are graphical representations which aid in the explanation of the low voltage detector circuit shown in FIG. 1.

DESCRIPTION OF THE PREFERRED EMBODIMENT

Figure 1:
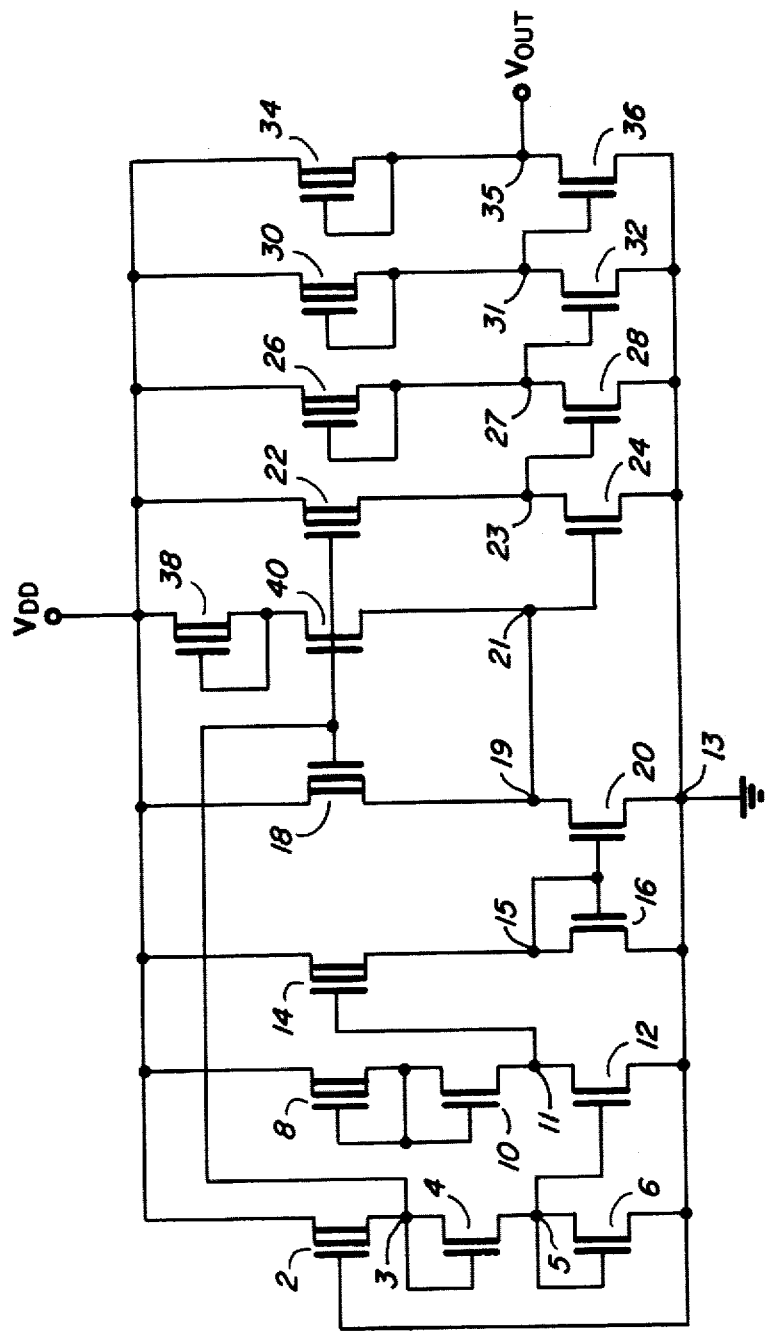
FIG. 1 is a schematic diagram of the inventive low voltage detector.

The inventive low voltage detector circuit comprises a reference voltage generator, a divider circuit having an input coupled to an output of the reference voltage generator, a comparator circuit having a first input coupled to the divider output and having a second input coupled to the reference voltage, a plurality of regularly biased inverter stages for amplifying the comparator output and optionally a compensation circuit.

The reference voltage generating portion of the circuit comprises depletion device 2 and enhancement devices 4 and 6. Field effect transistors 2 has its drain coupled to a voltage supply terminal $V_{DD}$ and has a gate electrode coupled to a second voltage supply terminal 13. Terminal 13 is illustrated as being a ground or reference point since for purposes of illustration all field effect transistors shown in FIG. 1 are N-channel devices. The source electrode of field effect transistor 2 is coupled to node 3. Field effect transistors 4 and 6 are connected in series between node 3 and terminal 13. Transistors 4 and 6 each have gate electrodes coupled to their drain electrodes. The source electrode of transistor 4 is coupled to the drain electrode of transistor 6, and the source electrode of transistor 6 is coupled to terminal 13. Transistors 2, 4 and 6 provide a constant reference voltage at node 3. Once the power supply voltage $V_{DD}$ exceeds a certain level (approximately 2.4 volts) the voltage appearing at node 3 remains constant even if the power supply voltage continues to rise. The voltage at node 5 tracks the voltage at node 3 but is approximately one enhancement threshold lower.

Curve A in FIGS. 2a and 2b illustrates the reference voltage characteristic generated at node 3. As may be seen, the reference voltage increases substantially linear to a certain point (approximately 2.4 volts) and then becomes relatively constant. While the reference voltage is generally some nominal value ($V_{RNOM}$), it may vary with temperature and processing variations between upper and lower worst case values; i.e. $V_{RH}$ and $V_{RL}$. The upper worst case value $V_{RH}$ is approximately 2.64 volts while the lower worst case value $V_{RL}$ is approximately 2.2 volts. The operation of this circuit is described in detail in copending application Ser. No. 939,725 filed Sept. 5, 1978 and entitled "FET VOLTAGE DETECTING CIRCUIT", now U.S. Pat. No. 4,224,539.

The voltage dividing portion of the circuit comprises depletion device 8 and enhancement devices 10 and 12. Depletion device 8 has a drain coupled to $V_{DD}$ and has gate and source electrodes coupled to the gate and drain electrodes of enhancement device 10. Device 12 is coupled between terminal 13 and the source electrode of device 10 and has a gate electrode coupled to node 5 in the reference voltage generating portion of the circuit.

The operation of voltage dividing portion of the circuit may best be described with reference to FIG. 2a. As described previously, curve A illustrates the reference voltage characteristics. The supply voltage $V_{DD}$ is plotted on the abscissa and the divided down voltage $V_D$ plotted on the ordinate. Line B represents the locus of points at which $V_D$ equals $V_{DD}$. Switching is to occur at point where line B intersects the reference voltage. It may be seen, however, that such an intersection may occur anywhere between $V_1$ and $V_2$. Therefore, the range between $V_1$ and $V_2$ represents error which could occur in the switching voltage.

Line B is the result of a purely resistive voltage divider. Instead of using a resistive voltage divider, the inventive circuit employs field effect transistors 8 and 10 which produce an output voltage characteristic at node 11 corresponding to curve C in the FIG. 2a. As may be seen, in the range of interests (between $V_{RL}$ and $V_{RH}$), curve C has a much greater slope than line B. Thus, the intersections of curve C ($V_3$ and $V_4$) with the lower and upper worst case reference voltages occur within a narrower range than was the case with line B. That is, $V_4$ minus $V_3$ is less than $V_2$ minus $V_1$. Therefore, the margin of switching voltage error has been reduced.

The non-linear voltage divider operates as follows. As the supply voltage $V_{DD}$ increases from a low voltage (e.g. zero volts), the voltage at node 5 and therefore at the gate of enhancement device 12 will increase linearally. Current through depletion device 8 causes the voltage at the junction of devices 8 and 10 to increase. Thus, the voltage on the gates of both devices 8 and 10 will increase turning 8 and 10 on harder. At some value (approximately one enhancement threshold below 2.4 volts) the voltage on a gate of device 12 becomes constant. At this time, the current through device 12 becomes fixed. As the current being sourced by device 12 reaches a constant value, the voltage at node 11 begins increasing more rapidly. Thus, there results the non-linear characteristics shown in FIG. 2a.

The comparator section of the circuit comprises depletion devices 14, 18 and 22 and enhancement devices 16, 20 and 24. Devices 14 and 16 have the current conducting path coupled in series between $V_{DD}$ and ground. Devices 18, 20 and 22, 24 are similarly oriented between $V_{DD}$ and ground. The gate of depletion device 14 represents a first input of the comparator and is coupled to the divided down voltage at node 11, and the gate of device 18 acts as a second input to the comparator and is coupled to the reference voltage generated at node 3 in the reference voltage generator. The gates of devices 16 and 20 are coupled together and are likewise coupled to the source of device 16.

If for example, the divided down voltage and the reference voltage were equal, then the voltages at the gates of device 14 and 18 would be the same and the voltage at the gates of device 16 and 20 would be the same. Therefore, the voltages at node 15 and 19 are equal assuming, of course, that devices 14 and 18 and devices 16 and 20 are substantially geometrically equivalent. If now the divided down voltage at node 11 should become less than a reference voltage, device 14 will conduct less current causing the voltage on the gates of devices 16 and 20 to be reduced. Therefore, device 20 will conduct less current. However, since 18 is still receiving the same reference voltage drive signal, the voltage at node 19 will rise. This increased voltage which is coupled to the gate of device 24 will cause device 24 to turn on harder. Since the gate of depletion device 22 is coupled to the reference voltage, the voltage at node 23 which is the output of the comparator will be reduced. A more detailed discussion of this comparator circuit can be found in U.S. Pat. application Ser. No. 35,039 filed of even date herewith and entitled "DIFFERENTIAL AMPLIFIER", now U.S. Pat. No. 4,243,945.

Coupled to the output of the comparator (node 23) are three regularly biased inverter stages; i.e., depletion device 26 and enhancement device 28, depletion device 30 and enhancement device 32, and depletion device 34 and enhancement device 36. Each of these inverter stages is coupled between $V_{DD}$ and ground, and in each case the gate of the depletion device is coupled to its source and the gate of the enhancement device is coupled to the output of the previous stage. The gate of enhancement device 28 is coupled to the comparator output (node 23). Each of these stages inverts the signal appearing at the output of the previous stage. For example, if the voltage at node 23 is low, then the circuit output (node 35) will be high. Thus, the circuit generates an output voltage whenever the divided down voltage falls to low.

The inverter stages also amplify the offset switching voltage inherent in the comparator stage. The inventive low voltage detector utilizes this characteristic in the following manner. Referring to FIG. 2b, there is again shown the reference voltage characteristic (curve A) having upper and lower worst case values. Line D illustrates a first voltage divided down from $V_{DD}$, and line E illustrates a second voltage which is further divided down from $V_{DD}$. It can be seen that line E intersects the upper and lower worst case reference voltages over a broader range ($\Delta V_2$) than does curve E ($\Delta V_1$). It should therefore be apparent that as $V_{DD}$ is divided down further, the range over which switching will occur increases. This is clearly due to the fact that line E has a slope which is lower than that of line D. To increase the switching voltage, it would be desirable if the intersecting characteristics of line D could be shifted to the right in a parallel fashion to intersect the reference voltage at a higher voltage without a corresponding reduction in slope; i.e., without increasing the switching voltage range. The desired result is shown by line F. This result is achieved by the inventive circuit since each of the inverter stages further amplifies the switching voltage offset inherent in the comparator.

The circuit may be made more accurate by the inclusion of depletion device 38 and enhancement device 40 having their current conducting paths coupled in series between $V_{DD}$ and node 21. The gate of device 30 is coupled to its source and the gate of device 40 is coupled to the reference voltage. As the threshold voltages of the depletion devices approach worst case due to processing variations, enhancement device 40 will cause more current to be pumped into node 21 thus maintaining the output voltage at node 23.

For the sake of completeness, the following list indicates suitable device dimensions for use in the inventive detector circuit.

| Item | Width/Length (Microns) |
| --- | --- |
| 2,8 | 25/10 |
| 4,6 | 24/10 |
| 10,12 | 20/10 |
| 14,18,22 | 8/50 |
| 16,20,24 | 100/8 |
| 26,34 | 8/12 |
| 30 | 8/8 |
| 28 | 20/6 |
| 32 | 60/6 |
| 36 | 32/6 |
| 38,40 | 8/30 |

The foregoing description of a preferred embodiment is given by way of example only and is not intended to limit the scope of the appended claims. No attempt has been made to illustrate all possible embodiments, but rather only to illustrate the principles of the invention in the best manner presently known to practice them. For example, the subject may be implemented in NMOS, PMOS, CMOS, etc. These and other modifications as may occur to one skilled in the art are within the spirit and scope of the invention as defined by the appended claims.

I claim:

1. A circuit for detecting when a supply voltage falls below a predetermined value, comprising:
   first means for receiving said supply voltage and generating therefrom a first reference voltage;
   voltage dividing means coupled to said supply voltage for producing a non-linear divided voltage therefrom;
   comparing means coupled to said first means and said voltage dividing means for generating an output when said divided voltage falls below said first reference voltage; and
   amplifying means coupled to said comparing means for amplifying said output.

2. A circuit for detecting when a supply voltage falls below a predetermined value, comprising:
   first means for receiving said supply voltage and generating therefrom a first reference voltage;
   voltage dividing means coupled to said supply voltage for producing a non-linear divided voltage therefrom, comprising:
     a first field effect transistor having source, gate and drain electrodes, said drain electrode coupled to said supply voltage and said gate electrode coupled to said source electrode;
     a second field effect transistor having source, gate and drain electrodes, said drain electrode coupled to the source and gate electrodes of the first field effect transistor and coupled to the gate electrode of said second field effect transistor; and
     a third field effect transistor having source, gate and drain electrodes, said source electrode coupled to a second reference voltage, said gate electrode coupled to said first means and said drain electrode coupled to the source electrode of said second field effect transistor;
   comparing means coupled to said first means and to the source electrode of said second field effect transistor of said voltage dividing means for generating an output when said divided voltage falls below said first reference voltage; and
   amplifying means coupled to said comparing means for amplifying said output.

3. A circuit according to claim 2 wherein said first field effect transistor is of the depletion type and wherein said second and third field effect transistors are of the enhancement type.

4. A circuit according to claim 3 wherein said first, second and third field effect transistors are N-channel devices.

5. A circuit according to claim 2 wherein said amplifying means comprises at least one regularly biased MOS inverter stage coupled between said supply voltage and ground and having an input coupled to the output of said comparing means.

6. Circuit according to claim 5 wherein said comparing means comprises:
   a fourth field effect transistor having source, gate and drain electrodes, said drain electrode coupled to said supply voltage and said gate electrode coupled to said divided voltage;
   a fifth field effect transistor having source, gate and drain electrodes, the drain electrode of said fifth transistor coupled to the source electrode of said fourth transistor and coupled to the gate electrode of said fifth transistor, and said source electrode coupled to said second reference voltage;
   a sixth field effect transistor having source, gate and drain electrodes, said drain electrode coupled to said supply voltage, and said gate electrode coupled to said first reference voltage;
   a seventh field effect transistor having source, gate and drain electrodes, said drain electrode coupled to the source electrode of said sixth transistor, said gate electrode coupled to the gate electrode of said fifth transistor, and said source electrode coupled to said second reference voltage;
   an eighth field effect transistor having source, gate and drain electrodes, said drain electrode coupled to said supply voltage, and said gate electrode coupled to said first reference voltage; and
   a ninth field effect transistor having source, gate and drain electrodes, said drain electrode coupled to the source electrode of said eighth transistor, said source electrode coupled to said second reference voltage, and said gate electrode coupled to the source of said sixth transistor and to the drain of said seventh transistor.

7. The circuit according to claim 6 wherein said fourth, sixth and eighth transistors are of the depletion type and wherein said fifth, seventh and ninth transistors are of the enhancement type.

8. A circuit according to claim 7 wherein said fourth, fifth, sixth, seventh, eighth and ninth transistors are N-channel field effect transistors.

9. A circuit according to claim 6 further including voltage compensating means coupled to the gate electrode of said ninth field effect transistor.

10. A circuit according to claim 9 wherein voltage compensating means comprises:
   a tenth field effect transistor having source, gate and drain electrodes, said drain electrode coupled to said supply voltage and said gate electrode coupled to said source electrode; and
   an eleventh field effect transistor having source, gate and drain electrodes, said drain electrode coupled to the source and gate electrodes of said tenth field effect transistor, said gate electrode coupled to said first reference voltage and said source electrode coupled to the gate electrode of said ninth transistor.

11. A circuit according to claim 10 wherein said tenth transistor is of the depletion type and wherein said eleventh transistor is of the enhancement type.

12. A circuit according to claim 11 wherein said tenth and eleventh transistors are N-channel field effect transistors.

13. A circuit according to claim 5 wherein said comparing means has an inherent offset error which is amplified by said at least one regularly biased inverter stage.

* * * * *